(12) United States Patent
Recchia et al.

(10) Patent No.: US 8,652,761 B2
(45) Date of Patent: *Feb. 18, 2014

(54) PHOTOSENSITIVE RESIN LAMINATE AND THERMAL PROCESSING OF THE SAME

(76) Inventors: David A. Recchia, Smyrna, GA (US); Joseph H. Blair, Dallas, GA (US); Ryan W. Vest, Cumming, GA (US)

( * ) Notice: Subject to any disclaimer, the term of this patent is extended or adjusted under 35 U.S.C. 154(b) by 161 days.

This patent is subject to a terminal disclaimer.

(21) Appl. No.: 13/030,810

(22) Filed: Feb. 18, 2011

(65) Prior Publication Data

US 2012/0214102 A1    Aug. 23, 2012

(51) Int. Cl.
*B41N 1/00*  (2006.01)
*G03F 7/00*  (2006.01)
*G03F 7/26*  (2006.01)

(52) U.S. Cl.
USPC ............... 430/306; 430/270.1; 430/271.1; 430/273.1; 430/296; 101/453

(58) Field of Classification Search
USPC ...................................... 430/5, 306
See application file for complete search history.

(56) References Cited

U.S. PATENT DOCUMENTS

| | | | |
|---|---|---|---|
| 5,506,086 A * | 4/1996 | Van Zoeren | 430/201 |
| 7,245,402 B2 | 7/2007 | McCrea | |
| 2006/0134557 A1 | 6/2006 | Hackler et al. | |
| 2010/0143840 A1 * | 6/2010 | Veres et al. | 430/270.1 |
| 2010/0143841 A1 * | 6/2010 | Stolt et al. | 430/270.1 |
| 2010/0242761 A1 | 9/2010 | Hackler et al. | |
| 2011/0079158 A1 * | 4/2011 | Recchia et al. | 101/395 |

FOREIGN PATENT DOCUMENTS

WO    WO 2011002967 A1 *    1/2011

* cited by examiner

*Primary Examiner* — Cynthia Kelly
(74) *Attorney, Agent, or Firm* — Carmody Torrance Sandak & Hennessey LLP

(57) ABSTRACT

A method of thermally developing photocurable printing blank to produce a relief pattern comprising a plurality of relief dots. The photocurable printing blank comprises a backing layer having at least one photocurable layer disposed thereon and a laser ablatable mask layer disposed on top of the at least one photocurable layer. The method includes the steps of (1) imaging the at least one photocurable layer by ablating portions of the laser ablatable mask layer; (2) laminating an oxygen barrier membrane to a top of the laser ablated mask layer; (3) exposing the printing blank to actinic radiation through the oxygen barrier membrane and mask layer to actinic radiation, thereby creating the relief pattern; (4) removing the oxygen barrier membrane; and (5) thermally developing the printing blank to remove the laser ablated mask layer and uncured portions of the photocurable layer and reveal the relief pattern. The presence of the oxygen barrier membrane produces printing dots having desired characteristics.

23 Claims, 12 Drawing Sheets

PHOTOSENSITIVE RESIN LAMINATE AND THERMAL PROCESSING OF THE SAME

FIELD OF THE INVENTION

The present invention relates generally to methods of thermally processing resin laminates to produce flexographic relief image printing elements for optimal printing.

BACKGROUND OF THE INVENTION

Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

Flexography is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Corrugated board generally includes a corrugating medium which is typically a layer of pleated or multi-grooved paperboard, called "flute", adjacent to a flat paper or paper-like layer called a "liner." A typical corrugated board construction comprises a flute layer sandwiched between two liner layers. Other embodiments may include multiple layers of flute and/or liner. The fluted interlayer provides structural rigidity to the corrugated board. Since corrugated board is used as packaging and formed into boxes and containers, the liner layer forming an exterior surface of the corrugated board is frequently printed with identifying information for the package. The exterior liner layer often has slight indentations due to the uneven support of the underlying flute layer.

A problem that may be encountered when printing on corrugated board substrates is the occurrence of a printing effect referred to as "fluting" (and which is also known as "banding" or "striping" or "washboarding"). Fluting may occur, when printing the liner on the exterior surface of the corrugated board, after the corrugated board has been assembled. The fluting effect is visible as regions of dark printing, i.e., bands of higher density, alternating with regions of light printing, i.e., bands of lighter density, that correspond to the underlying fluting structure of the corrugated board. The darker printing occurs where uppermost portions of the pleated innerlayer structure support the printing surface of the liner. The fluting effect can be apparent in areas of a printed image having tones or tint values where the inked areas represent a fraction of the total area as well as in areas of the printed image where the ink coverage is more complete. This fluting effect is typically more pronounced when printing with a flexographic printing element produced using a digital workflow process because of the shape of the dots produced by the digital process. Furthermore, increasing the printing pressure does not eliminate fluting, and the increased pressure can cause damage to the corrugated board substrate. Therefore, other methods are needed to reduce fluting when printing on corrugated board substrates.

A typical flexographic printing plate as delivered by its manufacturer is a multilayered article made of, in order, a backing, or support layer; one or more unexposed photocurable layers; optionally a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include sheets made from synthetic polymeric materials such as polyesters, polystyrene, polyolefins, polyamides, and the like. Generally the most widely used support layer is a flexible film of polyethylene terephthalate. The support sheet can optionally comprise an adhesive layer for more secure attachment to the photocurable layer(s). Optionally, an antihalation layer may also be provided between the support layer and the one or more photocurable layers. The antihalation layer is used to minimize halation caused by the scattering of UV light within the non-image areas of the photocurable resin layer.

The photocurable layer(s) can include any of the known photopolymers, monomers, initiators, reactive or non-reactive diluents, fillers, and dyes. The term "photocurable" refers to a composition which undergoes polymerization, crosslinking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No, 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may be used.

Photocurable materials generally cross-link (cure) and harden through radical polymerization in at least some actinic wavelength region. As used herein, actinic radiation is radiation capable of polymerizing, crosslinking or curing the photocurable layer. Actinic radiation includes, for example, amplified (e.g., laser) and non-amplified light, particularly in the UV and violet wavelength regions. One commonly used source of actinic radiation is a mercury arc lamp, although other sources are generally known to those skilled in the art.

The slip film is a thin layer, which protects the photopolymer from dust and increases its ease of handling. In a conventional ("analog") plate making process, the slip film is transparent to UV light. In this process, the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "direct to plate" plate making process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or heat plus a blotter (i.e., thermal development). Thermal development has the advantage of not requiring an additional drying step after development and thus provides the ability to go more quickly from plate to press.

Thermal development processes work by processing photopolymer printing plates using heat; the differential melting temperature between cured and uncured photopolymer is used to develop the latent image. The basic parameters of this process are known, as described in U.S. Pat. Nos. 7,122,295, 6,773,859, 5,279,697, 5,175,072 and 3,264,103 and in WO 01/88615, WO 01/18604, and EP 1239329, the teachings of each of which are incorporated herein by reference in their entirety. These processes allow for the elimination of development solvents and the lengthy plate drying times needed to remove the solvent. The speed and efficiency of these processes allow for their use in the manufacture of flexographic plates for printing newspapers and other publications where quick turnaround times and high productivity are important.

In order for printing plates to be thermally developable, the composition of the photopolymer must be such that there exists a substantial difference in the melt temperature between the cured and uncured polymer. It is precisely this difference that allows the creation of an image in the photopolymer when heated. The uncured photopolymer (i.e., the portions of the photopolymer not contacted with actinic radiation) melts and/or substantially softens while the cured photopolymer remains solid and intact at the temperature chosen. Thus, the difference in melt temperature allows the uncured photopolymer to be selectively removed, thereby creating the desired image.

Thereafter, uncured photopolymer can be softened and/or melted and removed. In most instances, the heated printing element is contacted with an absorbent material that absorbs or otherwise removes the softened and/or melted uncured photopolymer. This removal process is generally referred to as "blotting."

The resulting surface, after development, has a relief pattern that reproduces the image to be printed and which typically includes both solid areas and patterned areas comprising a plurality of relief dots. After the relief image is developed, the relief image printing element may be mounted on a press and printing commenced.

The shape of the dots and the depth of the relief, among other factors, affect the quality of the printed image. It is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (the dot is not "held" on plate and/or on press). Alternatively, if the dot survives processing they are susceptible to damage on press. For example small dots often fold over and/or partially break off during printing causing either excess ink or no ink to be transferred.

Furthermore, photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. It is therefore desirable for the dissolved oxygen to be removed from the resin composition before image-wise exposure so that the photocurable resin composition can be more rapidly and uniformly cured.

Various methods of removing dissolved oxygen have been developed for use in the art. For example, the removal of dissolved oxygen can be accomplished by placing the photosensitive resin plate in an atmosphere of inert gas, such as carbon dioxide gas or nitrogen gas, before exposure in order to displace the dissolved oxygen. A noted drawback to this method is that it is inconvenient and cumbersome and requires a large space for the apparatus. In addition, as discussed in more detail below, this approach has not been found to be particularly effective in digital printing elements that are thermally developed.

Another approach involves subjecting the plates to a preliminary exposure (i.e., "bump exposure") of actinic radiation. During bump exposure, a low intensity "pre-exposure" dose of actinic radiation is used to sensitize the resin before the plate is subjected to the higher intensity main exposure dose of actinic radiation. The bump exposure is applied to the entire plate area and is a short, low dose exposure of the plate that reduces the concentration of oxygen, which inhibits photopolymerization of the plate (or other printing element) and aids in preserving fine features (i.e., highlight dots, fine lines, isolated dots, etc.) on the finished plate. However, the presensitization step can also cause shadow tones to fill in, thereby reducing the tonal range of the halftones in the image.

The bump exposure requires specific conditions that are limited to only quench the dissolved oxygen, such as exposing time, irradiated light intensity and the like. In addition, a selective preliminary exposure, as discussed for example in U.S. Pat. Publication No. 2009/0043138 to Roberts et al., the subject matter of which is herein incorporated by reference in its entirety, has been proposed.

Other efforts have involved special plate formulations alone or in combination with the bump exposure, such as in U.S. Pat. No. 5,330,882 to Kawaguchi, the subject matter of which is herein, incorporated by reference in its entirety, which suggests the use of a separate dye that is added to the resin to absorb actinic radiation at wavelengths at least 100 nm removed from the wavelengths absorbed by the main photoinitiator. U.S. Pat. No. 4,540,649 to Sakurai, incorporated herein by reference in its entirety, describes a photopolymerizable composition that contains at least one water soluble polymer, a photopolymerization initiator and a condensation reaction product of N-methylol acrylamide, N-methylol methacrylamide, N-alkyloxymethyl acrylamide or N-alkyloxymethyl methacrylamide and a melamine derivative, which, according to the inventors, eliminates the need for pre-exposure conditioning and produces a chemically and thermally stable plate.

However all of these methods are still deficient in producing a relief image printing element having a superior dot structure, especially when designed for printing corrugated board substrates. In addition, all of the methods described above have also not been shown to produce a relief image printing element having superior dot structure when the relief image is subjected to a thermal development step.

When developing in solvent, the main consideration is whether or not the solvent can swell and disperse/dissolves the uncured photopolymer and associated barrier layers, in combination with the appropriate mechanical agitation, resulting in a clean printing plate free of contaminants, surface defects, or other unwanted solvent-based phenomenon common to the platemaking industry.

In contrast, developing plates thermally sometimes requires other considerations. Digital plates, when exposed by conventional means (i.e., in air) have previously been believed to be interchangeable whether subject to a solvent development process or a thermal development process, using the same base resin formulation. Analog thermal has shown itself to be more challenging, oftentimes requiring the use of a novel slip film or unique properties to the resin itself, such as very high melt flow.

Thus, there is a need for an improved process for preparing relief image printing elements that are subjected to a thermal development process.

There is also a need for an improved relief image printing element that comprises an improved relief structure including printing dots that are configured for superior printing performance on various substrates.

The present invention relates generally to a digital plate with dots of a controlled architecture beneficial to printing (i.e., flat top, steep shoulders), capable of being thermally processed with no detriment in plate quality or print performance.

The present invention also provides a means for exposing and processing an analog plate via the same exposure technique, which can also be processed thermally with no detriment to material quality or print performance.

SUMMARY OF THE INVENTION

It is an object of the present invention to provide an improved method of thermally developing digital relief image printing elements.

It is another object of the present invention to provide an improved method of thermally developing analog relief image printing elements.

It is another object of the present invention to provide an improved method of thermally developing relief image printing plate that produces printing dots having a flat top and steep shoulders.

It is still another object of the present invention to provide a method of imaging and developing relief image printing elements that provides a good result when printing on corrugated board substrates.

It is another object of the present invention to produce a relief image printing plate that reduces print fluting when printing on corrugated board substrates.

It is another object of the present invention to create a relief image printing element that comprises printing dots having a superior dot structure in terms of print surface, edge definition, shoulder angle, depth and dot height.

It is another object of the present invention to provide a dot shape and structure on the printing element that is highly resistant to print fluting.

It is still another object of the present invention to control the surface roughness of the print surface of the relief image printing element.

The inventors here have discovered that a characteristic of plates processed by thermal means is higher surface roughness of both solid areas and the tops of dots, as well as the floor of the plate. This is due to the fact that 'blotting' is incapable of removing all of the photopolymer during thermal processing. There is always some small amount of residual polymer left on the plate, both on the relief elements and on the plate's floor. The texture of the blotter material is typically transferred into this remnant photopolymer. In the floor areas of the plate, this distinctive pattern has only cosmetic effect. However, on the relief elements, this texture can be problematic. If the roughness of the texture is excessive, it can affect print quality by actually transferring the pattern to the surface being printed, resulting in qualitative print defects often described as mottling or pinholing, and the quantitative print defect of reduced solid ink density (SID). These defects generally degrade the quality of the printed articles made from plates with excessive roughness, reducing the vibrancy of colors and making it difficult to achieve consistent color reproduction.

Some degree of plate surface roughness can be beneficial to print performance, but excessive surface roughness can have the above-described negative effects. The definition of 'excessive' plate surface roughness varies depending upon many factors, including the substrate printed, the ink characteristics, and the amount of ink used on each image. Generally, the inventor have found that plate surface roughness of less than 2000 nm ($R_a$) is required to achieve good and uniform solid ink coverage, with plate surface roughness of less than 1200 nm preferred, and plate surface roughness of less than 800 nm most preferred.

To these ends, in a preferred embodiment, the present invention relates generally to a method of thermally developing a photocurable printing blank to produce a relief pattern comprising a plurality of relief dots, wherein the photocurable printing blank comprises a backing layer having at least one photocurable layer disposed thereon and a laser ablatable mask layer disposed on top of the at least one photocurable layer, the method comprising the steps of:

a) imaging the at least one photocurable layer by selectively ablating the laser ablatable mask layer to create an image on the surface of the at least one photocurable layer;

b) laminating an oxygen barrier membrane to a top of the laser ablated mask layer;

c) exposing the printing blank to actinic radiation through the oxygen barrier membrane and mask layer to one or more sources of actinic radiation to selectively crosslink and cure portions of the at least one photocurable layer, wherein the at least one photocurable layer is crosslinked and cured in the portions not covered by the mask layer, thereby creating the relief pattern;

d) removing the oxygen barrier membrane from the top of the laser ablated mask layer; and e) thermally developing the printing blank remove the laser ablated mask layer and uncured portions of the photocurable layer and reveal the relief pattern;

wherein the presence of the oxygen barrier membrane during the exposure step produces printing dots having desired characteristics.

In another preferred embodiment, the present invention relates generally to a method of thermally developing a photocurable printing blank to produce a relief pattern comprising a plurality of relief dots, wherein the photocurable printing blank comprises a backing layer having at least one photocurable layer disposed thereon, the method comprising the steps of:

a) laminating an oxygen barrier membrane to a top of the photocurable layer;
b) placing a negative of a desired relief image on top of the oxygen barrier membrane;
c) exposing the printing blank to actinic radiation through the oxygen barrier membrane and negative to selectively crosslink and cure the at least one photocurable layer, wherein the at least one photocurable layer is crosslinked and cured in the areas that are not covered by the negative, thereby creating the desired relief image;
d) removing the oxygen barrier membrane and the negative from the top of the at least one photocurable layer; and
e) thermally developing the printing blank to remove uncured portions of the photocurable layer and reveal the desired relief image;

wherein the presence of the oxygen barrier membrane during the exposure step results in the plurality of printing dots having desired characteristics.

The negative can also act as an oxygen barrier itself. If this is the case, then the negative should be laminated to the at least one photocurable layer and the separate oxygen barrier membrane is not required. In this case the desired image can be created by ink jetting a radiation opaque material onto the oxygen barrier so that it can serve as a negative also.

BRIEF DESCRIPTION OF THE DRAWINGS

For a fuller understanding of the invention, reference is had to the following description taken in connection with the accompanying figures, in which.

DETAILED DESCRIPTION OF THE INVENTION

Figure 1:
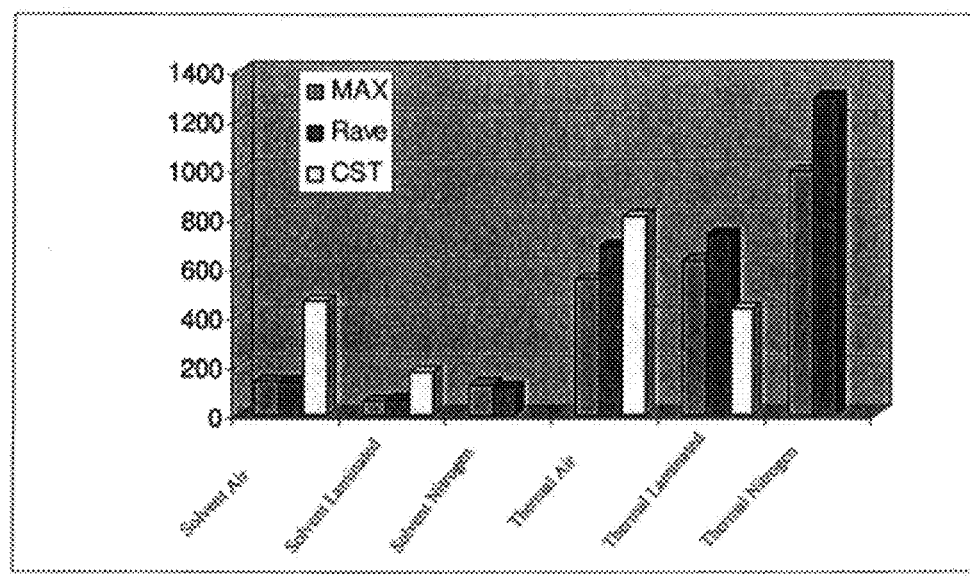
FIG. 1 depicts a graph of surface roughness values of digital plates exposed and processed via various techniques.

The inventors of the present invention have found that the shape and structure of a printing dot has a profound impact on the way it prints. This is especially true in digital relief image printing elements. The inventors of the present invention have also determined that there special considerations which must be addressed when using thermal development processes to provide a relief surface that includes relief printing dots having flat tops and steep shoulders.

The inventors of the present invention have discovered that there is an advantage to reducing the impact of oxygen inhibition during plate exposure while simultaneously maintaining the physical properties necessary to produce high quality thermally processed printing plates.

The present invention relates generally to the lamination of a barrier membrane onto the surface of an ablated digital plate or an uncoated plate that can be imaged via an analog method. The subsequent plate is then thermally processed to remove uncured photopolymer, thereby producing a relief printing plate. The membrane's function is to serve as a oxygen barrier which allows for altering of the shape of the formed dots on the printing plate. The result of the use of this barrier layer is the advantageous control of the curing mechanism such that the following occurs:

1) Dots are formed without the restricting effect of oxygen inhibition, resulting in flat tops and steep shoulder angles;
2) The curing rate is controlled to the point that optimum reverse depths are maintained and should angles are not excessively broadened;
3) The resulting membrane lamination minimizes the creation of excessive surface roughness during thermal processing; and
4) The resulting membrane allows for more efficient thermal processing of an analog printing form than currently existing analog plate constructions, since the membrane is removed prior to processing.

The present invention utilizes the aforementioned advantages of the laminated membrane as an oxygen barrier and combines them with the surprising discovery that laminated thermally processed plates perform better in print studies than standard thermally processed plates as well as those exposed in inert gas media, showing reduced dot gain and cleaner solids and reverse print.

In a preferred embodiment, the present invention relates generally to a method of thermally developing a photocurable printing blank to produce a relief pattern comprising a plurality of relief dots, wherein the photocurable printing blank comprises a backing layer having at least one photocurable layer disposed thereon and a laser ablatable mask layer disposed on top of the at least one photocurable layer, the method comprising the steps of:

a) imaging the at least one photocurable layer by selectively ablating the laser ablatable mask layer to create an image on the surface of the at least one photocurable layer;
b) laminating an oxygen barrier membrane to a top of the laser ablated mask layer;
c) exposing the at least one photocurable layer to actinic radiation through the oxygen barrier membrane and mask layer to one or more sources of actinic radiation to selectively crosslink and cure portions of the at least one photocurable layer, wherein the at least one photocurable layer is crosslinked and cured in the portions not covered by the mask layer, thereby creating the relief pattern;

d) removing the oxygen barrier membrane from the top of the laser ablated mask layer; and e) thermally developing the printing blank remove the laser ablated mask layer and uncured portions of the photocurable layer and reveal the relief pattern;

wherein the presence of the oxygen barrier membrane produces printing dots having desired geometric parameters.

The desired geometric parameters of the printing dots are typically one or more of steep shoulder angles, planarity of the dot surface, sufficient depth of relief between the dots, sharpness of the edge at the point where the dot top transitions to the dot shoulder, low surface roughness and combinations thereof. One can manipulate the resultant shape of the printing dots to optimize printing by utilizing the methods described herein.

Figure 7:
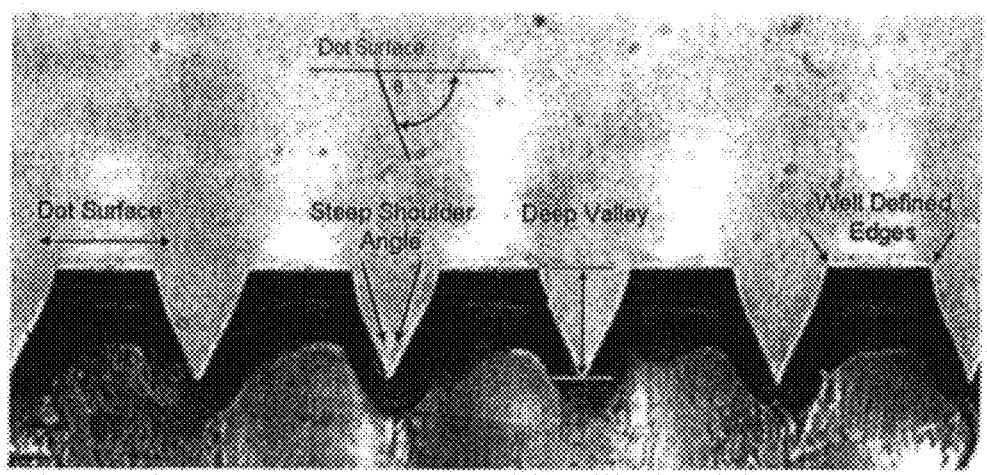
FIG. 7 depicts a schematic representation of four dot shape measurements related to the creation of an optimum dot for flexographic printing.

The inventors of the present invention have found that a particular set of geometric characteristics define a flexo dot shape that yields superior printing performance, as shown in FIG. 7. These geometric parameters include, but are not limited to, (1) planarity of the dot surface; (2) shoulder angle of the dot; (3) depth of relief between the dots; and (4) sharpness of the edge at the point where the dot top transitions to the dot shoulder. These geometric parameters are described in more detail in related patent application Ser. No. 12/571,523 to Recchia and Ser. No. 12/660,451 to Recchia et al., the subject matter of each of which is herein incorporated by reference in its entirety. However the particular use of these geometric parameters in optimizing print quality of printing dots produced in thermally development processes has not been previously been investigated.

Figure 8:
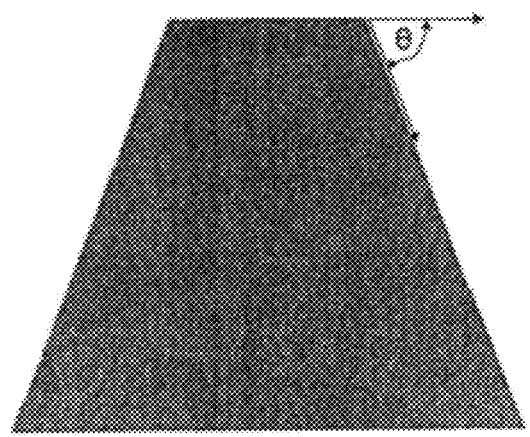
FIG. 8 depicts the measurement of the dot shoulder angle $\theta$.

Firstly, the angle of the dot shoulder has been found to be a good predictor of print performance. The dot shoulder is defined as shown in FIG. 8 as the angle θ formed by the dot's top and side. At the extreme, a vertical column would have a 90° shoulder angle, but in practice most flexo dots have an angle that is considerable lower, often nearer 45° than 90°.

The shoulder angle can vary depending on the size of the dots as well. Small dots, for example in the 1-15% range, may have large shoulder angles, while larger dots, for example greater than about 15% dots may exhibit smaller shoulder angles. It is desirable for all dots to have the largest shoulder angle possible. In one embodiment, the desired characteristics comprise steep shoulder angles and the shoulder angle of each of the plurality of dots is such that the overall shoulder angle is greater than about 50°, preferably greater than about 70°.

There are two competing geometric constraints on shoulder angle—dot stability and impression sensitivity. A large shoulder angle minimizes impression sensitivity and gives the widest operating window on press, but at the expense of dot stability and durability. In contrast, a lower shoulder angle improves dot stability but makes the dot more sensitive to impression on press. As used herein, dot shoulder angle means the angle formed by the intersection of a horizontal line tangential to the top of the dot and a line representing the adjacent dot side wall.

Figure 10:
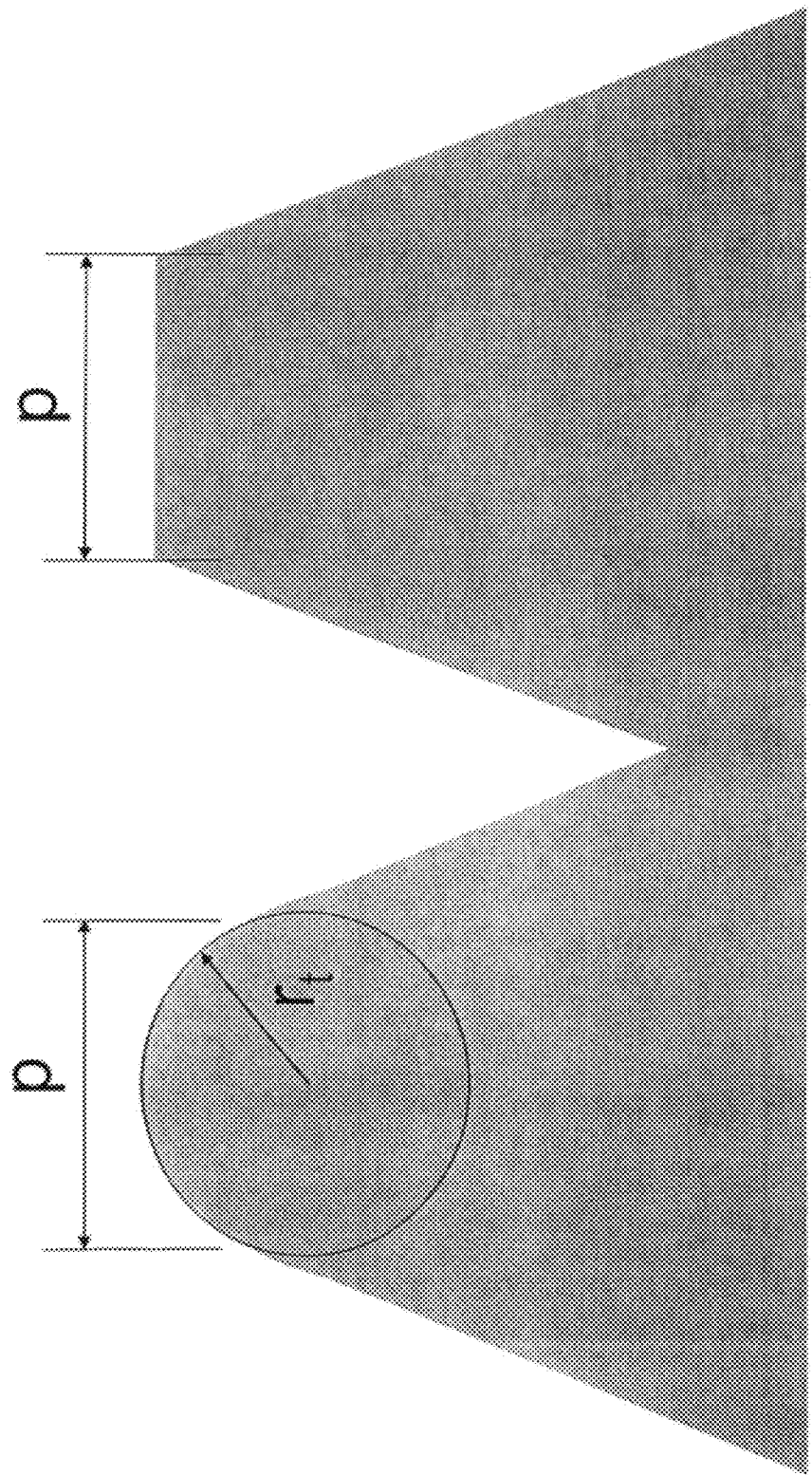
FIG. 10 depicts a means of characterizing the planarity of a dot's printing surface where p is the distance across the dot top and $r_t$ is the radius of curvature across the surface of the dot.

In another embodiment, the desired characteristics comprise planarity of the dot surface. The planarity of the top of a dot can be measured as the radius of curvature across the top surface of the dots, $r_t$, as shown in FIG. 10. Preferably, the top surface of the dot has a planarity, where the radius of curvature of the dot top is greater than the total thickness of the at least one layer of photocurable material, more preferably twice the thickness of the at least one layer of photocurable material, and most preferably, more than three times the total thickness of the photopolymer layer. A planar dot surface is preferred throughout the tonal range. Most preferred are planar dot surfaces, even on dots in the highlight range (i.e., 0-10% tonal).

In still another embodiment, the desired characteristic of the printing dots is low surface roughness and the surface roughness of the top of the plurality of relief printing dots is less than about 2000 nm, preferably less than about 1250 nm, and most preferably less than 800 nm.

Figure 9:
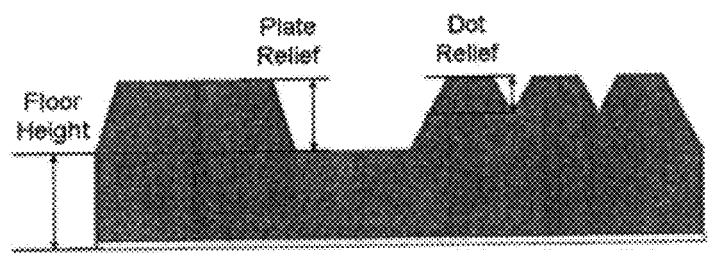
FIG. 9 depicts relief image definitions.

In another embodiment, the desired characteristic of the printing dots is sufficient depth of relief between the dots, and a dot relief of printing element is greater than about 9% of the overall plate relief, preferably greater than about 12% of the overall plate relief. Plate relief is expressed as the distance between the floor of the plate and the top of a solid relief surface, as shown in FIG. 9. For example, a 0.125 inch thick plate is typically made so as to have an 0.040 inch relief. However, the plate relief is typically much larger than the relief between dots in tone patches (i.e., the "dot relief"), which is a result of the close spacing of the dots in tonal areas. The low relief between dots in tonal areas means that the dots are structurally well-supported, but can cause problems during printing as ink builds up on the plate and eventually fills in the areas between dots, causing dot bridging or dirty print. The inventors have found that deeper dot relief can reduce this problem significantly, leading to longer print runs with less operator interference, a capability that is often called "cleaner printing."

Figure 11:
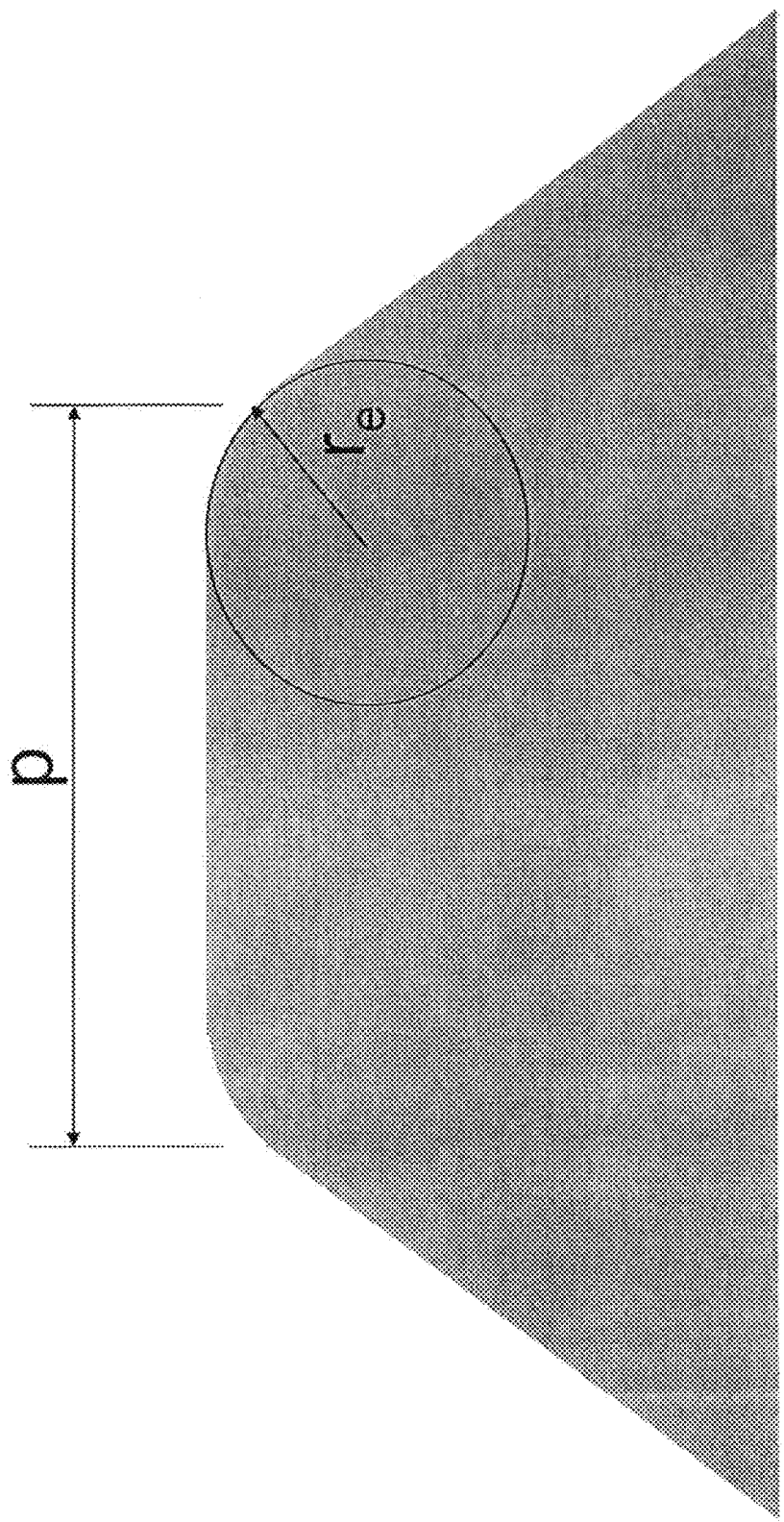
FIG. 11 depicts a flexo dot and its edge, where p is the distance across the dot top. This is used in the characterization of edge sharpness, $r_e$:p, where $r_e$ is the radius of curvature at the intersection of the shoulder and the top of the dot.

In another embodiment, the desired characteristic is sharpness of the edge at the point where the dot top transitions to the dot shoulder. It is generally preferred that the dot edges be sharp and defined. These well-defined dot edges better separate the "printing" portion from the "support" portion of the dot, allowing for a more consistent contact area between the dot and the substrate during printing. Edge sharpness can be defined as the ratio of $r_e$, the radius of curvature (at the intersection of the shoulder and the top of the dot) to p, the width of the dot's top or printing surface, as shown in FIG. 11. For a truly round-tipped dot, it is difficult to define the exact printing surface because there is not really an edge in the commonly understood sense, and the ratio of $r_e$:p can approach 50%. In contrast, a sharp-edged dot would have a very small value of $r_e$, and $r_e$:p would approach zero. In practice, an $r_e$:p of less than 5% is preferred, with an $r_e$:p of less than 2% being most preferred.

A wide range of materials can serve as the barrier membrane layer. Three qualities that the inventors have identified in producing effective barrier layers include optical transparency, low thickness and oxygen transport inhibition. Oxygen transport inhibition is measured in terms of a low oxygen diffusion coefficient. As noted, the oxygen diffusion coefficient of the oxygen barrier membrane is typically less than about $6.9 \times 10^{-9}$ m$^2$/sec, more preferably less than about $6.9 \times 10^{-10}$ m$^2$/sec, and most preferably less than about $6.9 \times 10^{-11}$ m$^2$/sec.

For thermal processing, the most preferred oxygen barrier membranes are clear films that minimize light scattering. Examples of materials which are suitable for use as the barrier membrane layer include polyamides, polyvinyl alcohol, hydroxyalkyl cellulose, polyvinyl pyrrolidinone, copolymers of ethylene and vinyl acetate, amphoteric interpolymers, cellulose acetate butyrate, alkyl cellulose, butryal, cyclic rubbers, and combinations of one or more of the foregoing. In addition, films such as polypropylene, polyethylene, polyvinyl chloride, polyester and similar clear films can also serve well as barrier films. In one preferred embodiment, the barrier membrane layer comprises a polypropylene film or a polyethylene terephthalate film. One particularly preferred barrier membrane is a Fuji® Final Proof receiver sheet membrane available from Fuji Films.

The barrier membrane should be as thin as possible, consistent with the structural needs for handling of the film and the film/photopolymer plate combination. Barrier membrane thicknesses between about 1 and 100 microns are preferred, with thickness of between about 1 and about 20 microns being most preferred.

The barrier membrane needs to have a sufficient optical transparency so that the membrane will not detrimentally absorb or deflect the actinic radiation used to expose the photosensitive printing blank. As such it is preferable that the barrier membrane have an optical transparency of at least 50%, most preferably at least 75%.

The barrier membrane needs to be sufficiently impermeable to oxygen diffusion so that it can effectively limit diffusion of oxygen into the photocurable layer during exposure to actinic radiation. The inventors herein have determined that the barrier membrane materials noted above in the thicknesses noted above will substantially limit the diffusion of oxygen into the photocurable layer when used as described herein.

In another embodiment of the present invention, the barrier membrane comprises a smooth nanotechnology film with a roughness of less than 100 nm. In this embodiment, the average surface roughness of the printing plate can be controlled to less than about 100 nm.

The barrier layer may be laminated to the surface of the printing plate using pressure and/or heat in a typical lamination process.

Suitable thermal development processes are generally well known to those skilled in the art. In one embodiment, the thermal development step comprises the steps of:
  a) softening non-crosslinked polymer on the imaged and exposed surface of the printing element by contacting the imaged and exposed surface with an absorbent layer capable of absorbing non-crosslinked portions of the at least one layer of photocurable material when it has been heated to a temperature of between 40° and 200° C.,
  b) heating said at least one layer of photocurable material to a temperature of between 40° and 200° C. and allowing the non-crosslinked portions of the at least one layer of photocurable material in contact with the absorbent layer to be absorbed by said absorbent layer, and
  c) removing said absorbent layer containing the non-crosslinked portion of the at least one photocurable layer, whereby the relief pattern is revealed.

Figure 6:
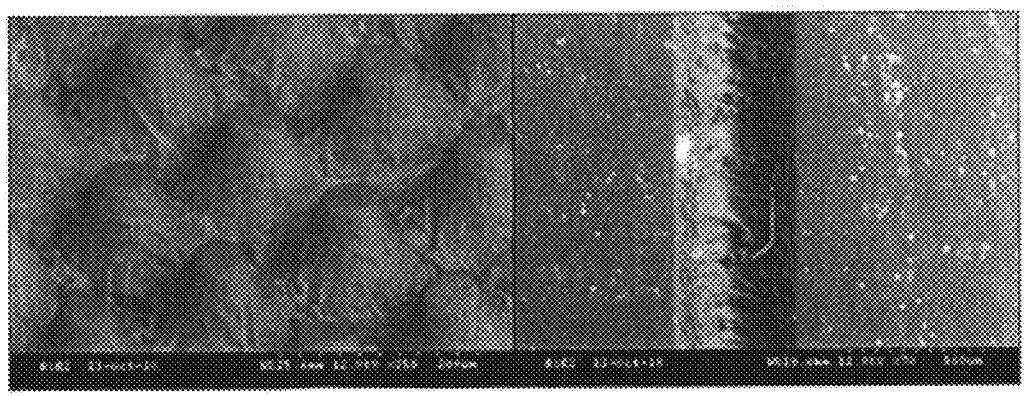
FIG. 6 depicts a view of the clean out achieved on an analog plate using the laminated thermal development process of the instant invention.

In addition, the barrier layer method can be used in an analog construction wherein a barrier layer is laminated to a photopolymer resin containing non infrared UV absorbing slip film layer. A negative is then placed upon the barrier layer, and the platemaking occurs via standard analog platemaking practices. FIG. 6 shows the clean-out achieved using this method.

More specifically, in another preferred embodiment, the present invention relates generally to a method of thermally developing a photocurable printing blank to produce a relief pattern comprising a plurality of relief dots, wherein the photocurable printing blank comprises a backing layer having at least one photocurable layer disposed thereon, the method comprising the steps of:
  a) laminating an oxygen barrier membrane to a top of the photocurable layer;
  b) placing a negative of a desired relief image on top of the oxygen barrier membrane;
  c) exposing the at least one photocurable layer to actinic radiation through the oxygen barrier membrane and negative to selectively crosslink and cure the at least one photocurable layer, wherein the at least one photocurable layer is crosslinked and cured in the areas that are not covered by the negative, thereby creating the desired relief image;
  d) removing the oxygen barrier membrane and the negative from the top of the at least one photocurable layer; and
  e) thermally developing the printing blank to remove uncured portions of the photocurable layer and reveal the desired relief image;
wherein the presence of the oxygen barrier membrane results in the plurality of printing dots having desired characteristics.

The negative can also act as an oxygen barrier itself. If this is the case, then the negative should be laminated to the at least one photocurable layer and the separate oxygen barrier membrane is not required. In this case the desired image can be created by ink jetting a radiation opaque material onto the oxygen barrier so that it can serve as a negative also.

To that end, in another embodiment, the present invention relates generally to a method of thermally developing a photocurable printing blank to produce a relief pattern comprising plurality of relief dots, wherein the photocurable printing blank comprises a backing layer having at least one photocurable layer disposed thereon, the method comprising the step of
  a) laminating a negative of a desired relief image on top of the at least one layer of photocurable material;
  b) exposing the printing blank to actinic radiation through the negative to selectively crosslink and cure the at least one photocurable layer, wherein the at least one photocurable layer is crosslinked and cured in the areas that are not covered by the negative, thereby creating the desired relief image;
  c) removing the negative from the top of the at least one layer of photocurable material; and
  d) thermally developing the printing blank to remove uncured portions of the photocurable layer and reveal the desired relief image,
wherein the negative serves as a oxygen barrier, which allows for altering of the shape of the formed relief dots.

FIG. 1 depicts a graph of the levels of surface roughness of digital plates that were exposed and processed by the indicated means. As can be seen from FIG. 1, the numbers change with process type, with thermal processing typically giving higher surface roughness values. In fact, the membrane lamination can reduce the surface roughness in the case of solvent processed materials as well, depending upon the product. Surprisingly, the oxygen-free environment provided by nitrogen does not improve the surface cure to a level that is impervious to the roughening/embossing effect that comes about from the impression of the non-woven media into the polymer surface at elevated temperatures. In fact, the roughness is noticeably increased when the plate is exposed under inert gas and then thermally processed.

Figure 2A:
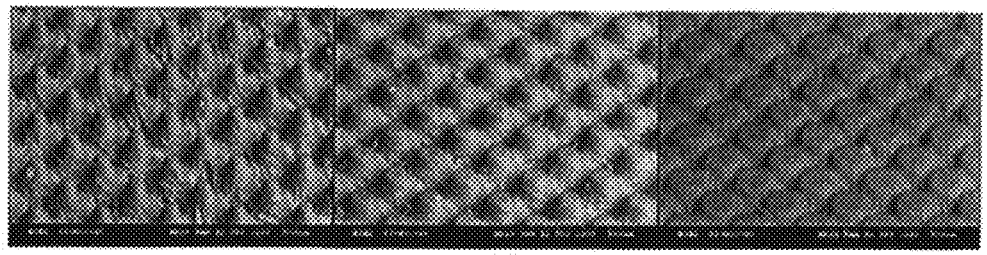
FIGS. 2A, 2B and 2C depict a comparison of thermally processed plate dots at 5%, 20% and 50% for conventional thermal, laminated thermal and nitrogen exposed thermal developing processes.
Figure 2B:
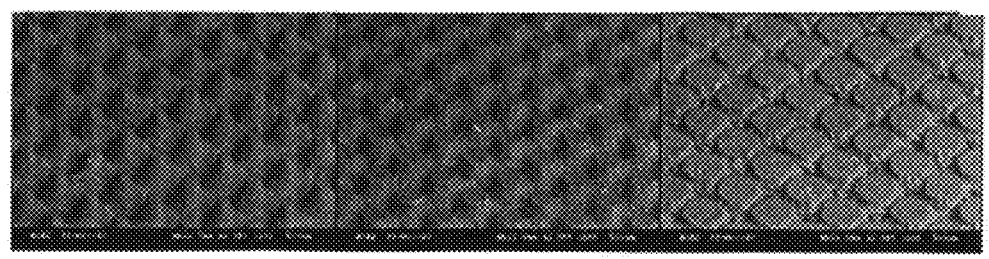
Figure 2C:
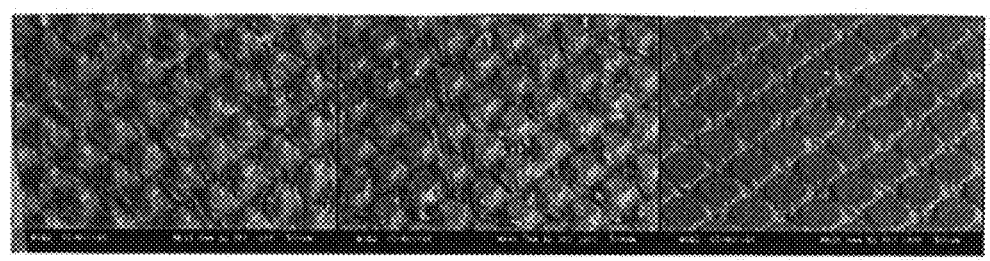

Shown in FIGS. 2A to 2C are dots and reverses of thermally developed plates. When compared with the nitrogen exposed plates shown in FIG. 2C, the reverses of the laminated processed plates shown in FIG. 2B are clearly deeper, the dot angles steeper, and the surface smoother than in the nitrogen exposed plate.

Table 1 shows the reverse depths of thermally processed plate materials exposed via lamination and inert gas techniques for 10 mil reverse, 15 mil reverse and 30 mil reverse.

TABLE 1

Reverse Depths of Thermally Processed Plate Materials Exposed Via Lamination and Inert Gas Techniques

| Plate Material | 10 mil reverse | 15 mil reverse | 30 mil reverse |
| --- | --- | --- | --- |
| Max, laminated | 3.55 | 4.35 | 9.00 |
| Max, nitrogen | 2.25 | 2.55 | 5.30 |
| Rave, laminated | 4.90 | 6.40 | 11.55 |
| Rave, nitrogen | 3.25 | 2.10 | 3.95 |
| CST, laminated | 4.65 | 5.65 | 10.50 |
| CST, nitrogen | 2.95 | 4.00 | 7.85 |

Figure 3A:
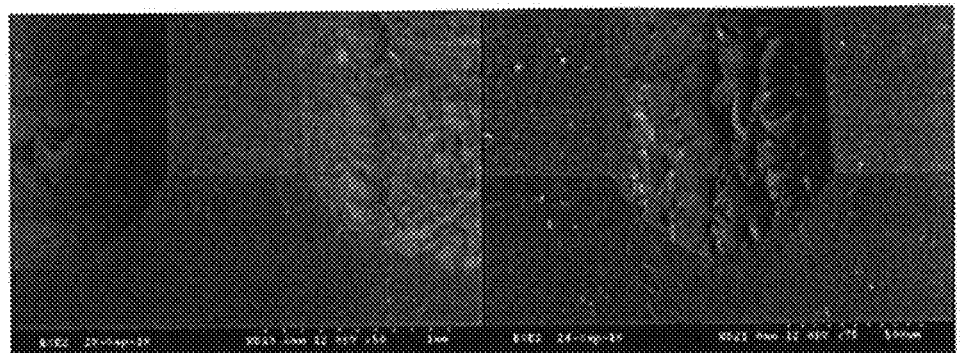
FIGS. 3A, 3B and 3C depict a comparison of thermally processed plate lines and reverses for conventional thermal, laminated thermal and nitrogen exposed thermal development processes.
Figure 3B:
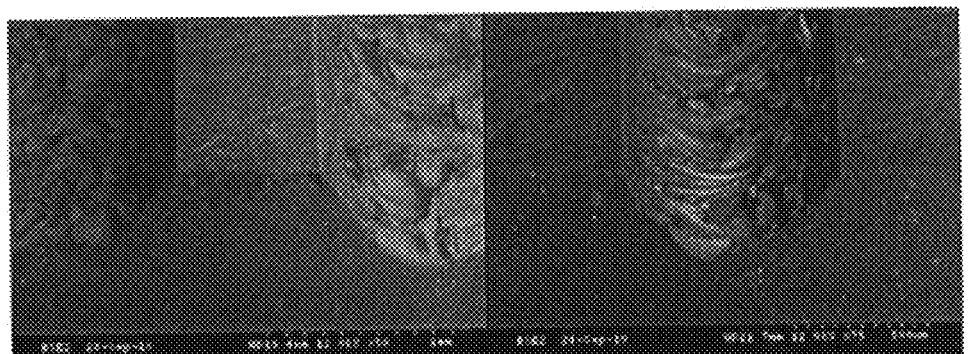
Figure 3C:
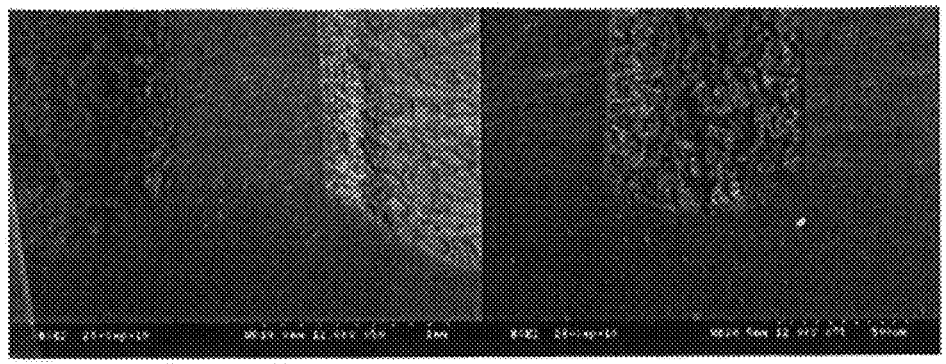
Figure 4A:
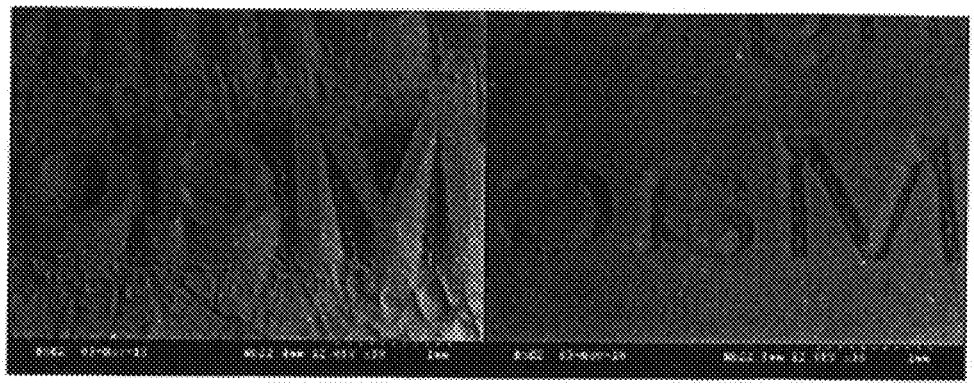
FIGS. 4A, 4B and 4C depict a comparison of text from thermally processed plates for conventional thermal, laminated thermal and nitrogen exposed thermal development processes.
Figure 4B:
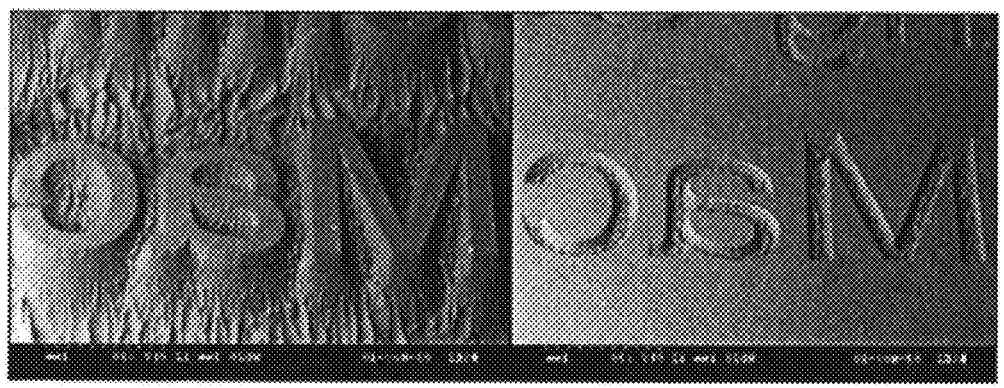
Figure 4C:
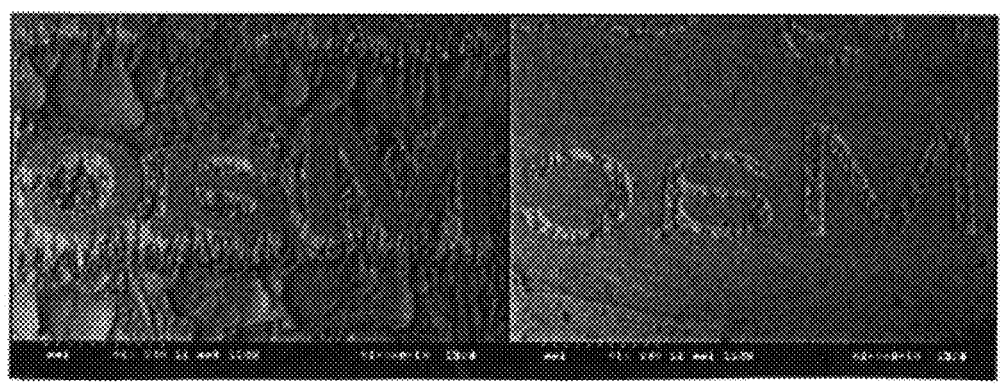

Shown in FIGS. 3A, 3B and 3C is a comparison of thermally processed plate lines and reverses for conventional thermal, laminated thermal and nitrogen exposed thermal development processes and shown in FIGS. 4A, 4B and 4C is a comparison of text from thermally processed plates for conventional thermal, laminated thermal and nitrogen exposed thermal development processes.

Figure 5A:
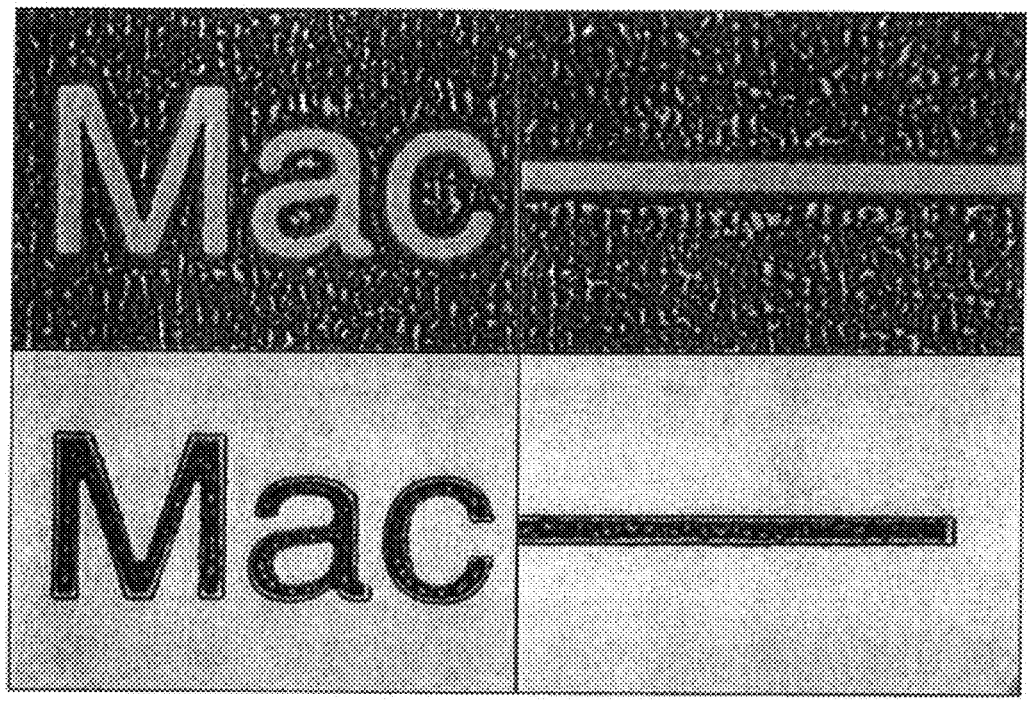
FIGS. 5A, 5B and 5C depict a comparison of print quality from thermally processed plates for conventional thermal, laminated thermal and nitrogen exposed thermal development processes.
Figure 5B:
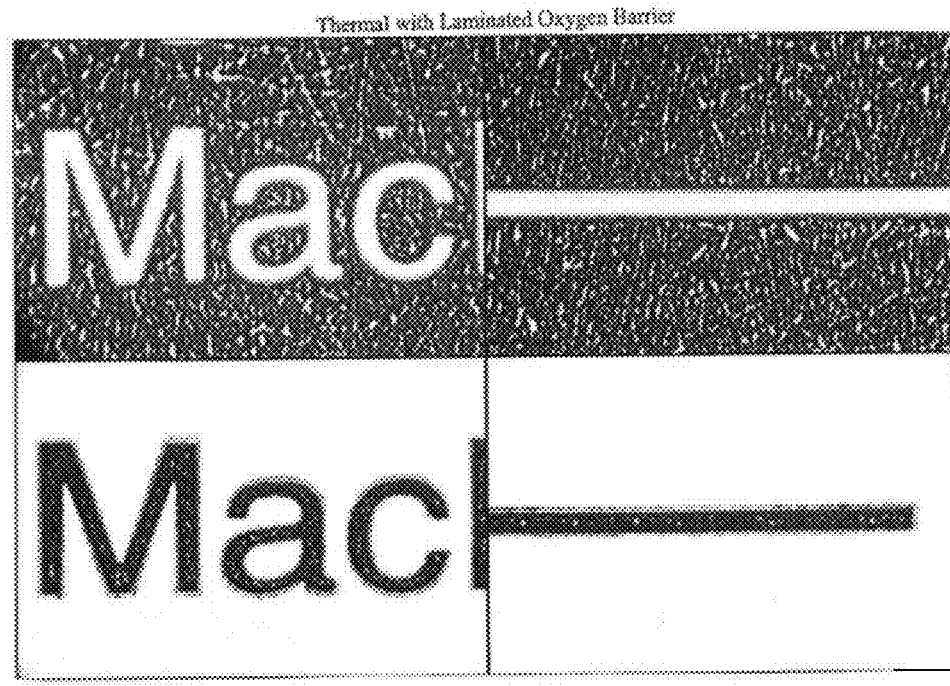
Figure 5C:
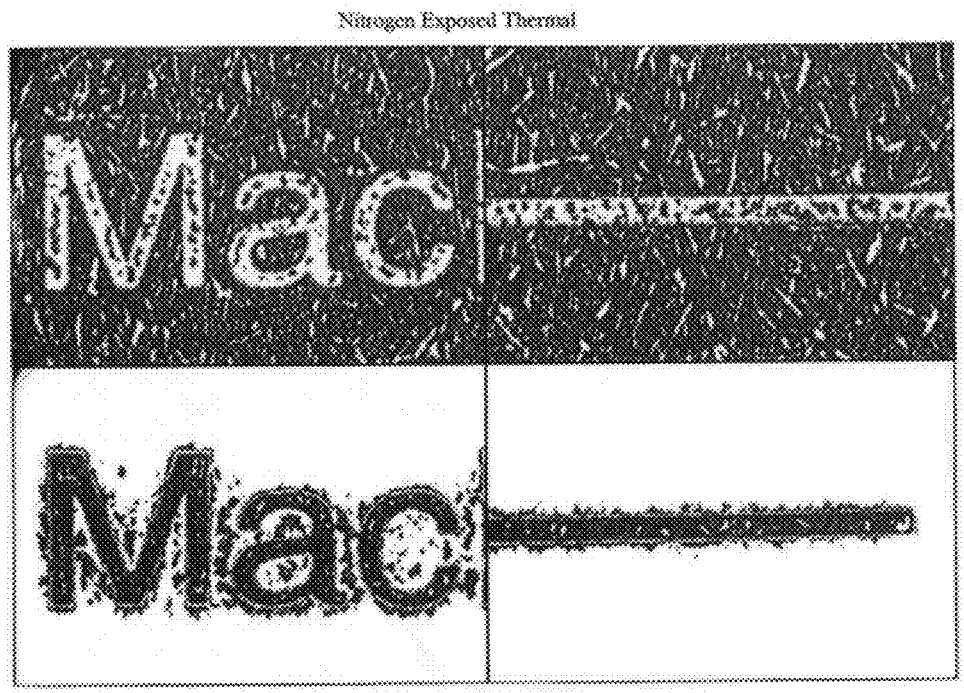

The resulting clean-out also impacts the final print performance. Shown in FIGS. 5A, 5B and 5C are comparisons of conventional thermal, laminated thermal, and nitrogen thermal plates, showing the clear difference in text sharpness and clarity.

Finally, once the plates have been subjected to thermal development, the relief image printing element is mounted on a printing cylinder of a printing press and printing is commenced.

Thus, it can be seen that the method of making the relief image printing element described herein produces a relief image printing element having a relief pattern comprising relief dots to be printed that are configured for optimal print performance. In addition, through the lamination method described herein, it is possible to make thermally developed plates, both digital and analog that have optimized geometric characteristics of the relief dots in the resulting relief image to produce a desired result.

What is claimed is:

1. A method of thermally developing a photocurable printing blank to produce a relief pattern comprising a plurality of printing dots, wherein the photocurable printing blank comprises a backing layer having at least one photocurable layer disposed thereon and a laser ablatable mask layer disposed on top of the at least one photocurable layer, the method comprising the step of:
   a) imaging the at least one photocurable layer by selectively ablating the laser ablatable mask layer to create an image on the surface of the at least one photocurable layer;
   b) laminating an oxygen barrier membrane to a top of the laser ablated mask layer;
   c) exposing the printing blank to actinic radiation through the oxygen barrier membrane and laser ablatable mask layer to one or more sources of actinic radiation to selectively crosslink and cure portions of the at least one photocurable layer, wherein the at least one photocurable layer is crosslinked and cured in the portions not covered by the mask layer, thereby creating the relief pattern;
   d) removing the oxygen barrier membrane from the top of the laser ablated mask layer; and
   e) thermally developing the photocurable printing blank to remove the laser ablated mask layer and uncured portions of the at least one photocurable layer and reveal the relief pattern.

2. The method according to claim 1, wherein the printing dots have one or more characteristics selected from:
   a) steep shoulder angles, wherein the shoulder angle of each of the printing dots is such that the overall shoulder angle is greater than about 50°;
   b) planarity of the printing dot surface, wherein the planarity of a top surface of the printing dots is such that the radius of curvature of the top surface of the printing dots, $r_t$, is greater than the total thickness of the at least one layer of photocurable material;
   c) sufficient depth of relief between the printing dots, wherein relief between the printing dots is greater than about 9% of overall relief;
   d) sharpness of the edge at the point where the printing dot top transitions to the printing dot shoulder, wherein a ratio of $r_e$:p is less than 5%; and
   e) low surface roughness, wherein the surface roughness of the top of the printing dots is less than about 700 nm.

3. The method according to claim 2, wherein the at least one characteristic comprises steep shoulder angles, wherein the shoulder angle of each of the printing dots is such that the overall shoulder angle is greater than about 50°.

4. The method according to claim 3, wherein the shoulder angle of each of the plurality of printing dots is such that overall shoulder angle is greater than about 70°.

5. The method according to claim 2, wherein the at least one characteristic comprises planarity of the printing dot surface, wherein the planarity of a top surface of the printing dots is such that the radius of curvature of the top surface of the printing dots $r_+$, is greater than the thickness of the at least one layer of photocurable material.

6. The method according to claim 2, wherein the at least one characteristic comprises low surface roughness, wherein the surface roughness of the top of the printing dots is less than about 700 nm.

7. The method according to claim 6, wherein the surface roughness of the top of the plurality of printing dots is less than about 800 nm.

8. The method according to claim 2, wherein relief is greater than about 12% of the overall relief.

9. The method according to claim 2, wherein the at least one characteristic comprises edge sharpness of the printing dots at the point where the printing dot top transitions to the printing dot shoulder, wherein a ratio of $r_e$:p is less than 5%.

10. The method according to claim 9, wherein the ratio of $r_e$:p is less than 2%.

11. The method according to claim 1, wherein the oxygen barrier membrane is selected from the group consisting of polyamides, polyvinyl alcohol, hydroxyalkyl cellulose, polyvinyl pyrrolidinone, copolymers of ethylene and vinyl acetate, amphoteric interpolymers, cellulose acetate butyrate, alkyl cellulose, butryal, cyclic rubbers, and combinations of one or more of the foregoing.

12. The method according to claim 1, wherein the oxygen barrier membrane comprises a clear film selected from the group consisting of polypropylene, polyethylene, polyvinyl chloride, polyester and combinations of one or more of the foregoing.

13. The method according to claim 12, wherein the oxygen barrier membrane comprises a polypropylene film or a polyethylene terephthalate film.

14. The method according to claim 1, wherein the oxygen barrier membrane has a thickness of between about 1 and 100 microns.

15. The method according to claim 14, wherein the oxygen barrier membrane has a thickness of between about 1 and about 20 microns.

16. The method according to claim 1, wherein the oxygen barrier membrane has an optical transparency of at least about 50%.

17. The method according to claim 16, wherein the oxygen barrier membrane has an optical transparency of at least about 75%.

18. The method according to claim 1, wherein the oxygen barrier membrane has an oxygen diffusion coefficient of less than $6.9 \times 10^{-9}$ m$^2$/sec.

19. The method according to claim 18, wherein the oxygen barrier membrane has an oxygen diffusion coefficient of less than $6.9 \times 10^{-10}$ m$^2$/sec.

20. The method according to claim 19, wherein the oxygen barrier membrane has an oxygen diffusion coefficient of less than $6.9 \times 10^{-11}$ m$^2$/sec.

21. The method according to claim 1, wherein the step of thermally developing the printing blank comprises:
   a) softening non-crosslinked polymer on the imaged and exposed surface of the printing blank by contacting the imaged and exposed surface with an absorbent layer capable of absorbing non-crosslinked portions of the at least one layer of photocurable material when it has been heated to a temperature of between 40° and 200° C.,
   b) heating said at least one layer of photocurable material to a temperature of between 40° and 200° C. and allowing the non-crosslinked portions of the at least one layer of photocurable material in contact with the absorbent layer to be absorbed by said absorbent layer, and
   c) removing said absorbent layer containing the non-crosslinked portion of the at least one photocurable layer, whereby the relief pattern is revealed.

22. The method according to claim 1, wherein the printing blank is not imaged in an inert environment.

23. The method according to claim 1, wherein the printing dots have one or more characteristics selected from:
   a) steep shoulder angles, wherein the shoulder angle of each of the printing dots is such that the overall shoulder angle is greater than about 50° C.;
   b) planarity of the printing dot surface, wherein the planarity of a top surface of the printing dots is such that the radius of curvature of the top surface of the printing dots, $r_t$, is greater than the total thickness of the at least one layer of photocurable material;
   c) sufficient depth of relief between the printing dots, wherein relief between the printing dots is greater than about 9% of the overall relief;
   d) sharpness of the edge at the point where the printing dot top transitions to the printing dot shoulder, wherein a ratio of $r_e$:p is less than 5%; and
   e) low surface roughness, wherein the surface roughness of the top of the printing dots is less than about 800 nm.

* * * * *